United States Patent
Samata

(10) Patent No.: US 11,469,711 B2
(45) Date of Patent: Oct. 11, 2022

(54) POWER AMPLIFIER CIRCUIT

(71) Applicant: Murata Manufacturing Co., Ltd., Kyoto (JP)

(72) Inventor: Mitsunori Samata, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 3 days.

(21) Appl. No.: 16/891,701

(22) Filed: Jun. 3, 2020

(65) Prior Publication Data

US 2020/0389128 A1 Dec. 10, 2020

(30) Foreign Application Priority Data

Jun. 4, 2019 (JP) .............................. JP2019-104227
Dec. 24, 2019 (JP) .............................. JP2019-232959

(51) Int. Cl.
*H03G 3/20* (2006.01)
*H03F 1/02* (2006.01)
*H03F 3/21* (2006.01)

(52) U.S. Cl.
CPC ............. *H03F 1/0205* (2013.01); *H03F 3/21* (2013.01); *H03F 2200/102* (2013.01); *H03F 2200/451* (2013.01)

(58) Field of Classification Search
CPC ....................................................... H03G 3/20
USPC .................................................. 330/129, 136
See application file for complete search history.

(56) References Cited

U.S. PATENT DOCUMENTS

| 8,970,299 | B2* | 3/2015 | Hase ........................ H03F 3/193 330/140 |
| 8,983,406 | B2  | 3/2015 | Zhang et al. |
| 9,257,943 | B2* | 2/2016 | Onishi .................... H03F 3/189 |
| 2010/0079211 | A1* | 4/2010 | Matsuda ................ H03H 7/383 330/306 |
| 2016/0013758 | A1* | 1/2016 | Cao ........................ H03F 1/0222 330/297 |

FOREIGN PATENT DOCUMENTS

JP 2010-87934 A 4/2010

* cited by examiner

*Primary Examiner* — Henry Choe
(74) *Attorney, Agent, or Firm* — Pearne & Gordon LLP

(57) ABSTRACT

A power amplifier circuit includes a transistor having a base to which a radio frequency signal is input and a collector to which a power supply voltage that varies in accordance with an envelope of amplitude of the radio frequency signal is supplied and from which an amplified signal obtained by amplifying the radio frequency signal is output; a first termination circuit provided at a stage subsequent to the transistor and configured to attenuate a harmonic component of the amplified signal; and a second termination circuit provided at the stage subsequent to the transistor and configured to attenuate a harmonic component of the amplified signal. The first termination circuit and the second termination circuit have a property of resonating for a radio frequency signal having a frequency between a frequency of a second harmonic component and a frequency of a third harmonic component.

10 Claims, 14 Drawing Sheets

POWER AMPLIFIER CIRCUIT

This application claims priority from Japanese Patent Application No. 2019-104227 filed on Jun. 4, 2019, and claims priority from Japanese Patent Application No. 2019-232959 filed on Dec. 24, 2019. The contents of these applications are incorporated herein by reference in their entireties.

BACKGROUND

The present disclosure relates to a power amplifier circuit. In communications using radio frequency (RF) signals of mobile units, such as cellular phones, a power amplifier circuit is used to amplify an RF signal. As a control method for efficiently amplifying an RF signal, there is envelope tracking (ET) control. In ET control, power is amplified by using a power supply voltage that varies in accordance with an envelope of the amplitude of a radio frequency signal.

In performing ET control, a harmonic component, such as a second harmonic component, of an RF signal has to be appropriately dealt with in the power amplifier circuit. Japanese Unexamined Patent Application Publication No. 2010-87934 discloses RF power amplifier that inhibits leakage of power of a second harmonic component with twice the frequency of a fundamental.

In the power amplifier circuit that performs ET control, a power supply voltage is controlled so that a saturation region of operation of a transistor is used. In the case where the transistor is caused to operate in the saturation region at a power supply voltage, output power of the transistor at the power supply voltage is high. When the output power is high, not only a fundamental component of an RF signal but also harmonic components increase. When a harmonic power amplifier that adjusts an impedance only for a second harmonic component as described in Japanese Unexamined Patent Application Publication No. 2010-87934 is used, impedance of third and higher harmonic components are not adjusted. A power amplifier circuit in this case is affected by third and higher harmonic components, and a region where the efficiency of a transistor is maximized is therefore not used for each power supply voltage subjected to ET control. The region where the efficiency is maximized is not used, and thus optimization of the power amplifier circuit that performs ET control is not able to be achieved.

BRIEF SUMMARY

The present disclosure has been made in consideration of such circumstances and provides a power amplifier circuit that efficiently amplifies power when a radio frequency signal is amplified by performing envelope tracking control.

A power amplifier circuit according to an aspect of the present disclosure includes a transistor having a base to which a radio frequency signal is input and a collector to which a power supply voltage that varies in accordance with an envelope of amplitude of the radio frequency signal is supplied and from which an amplified signal obtained by amplifying the radio frequency signal is output; a first termination circuit provided at a stage subsequent to the transistor and configured to attenuate a harmonic component of the amplified signal; and a second termination circuit provided at the stage subsequent to the transistor and configured to attenuate a harmonic component of the amplified signal. The first termination circuit and the second termination circuit have a property of resonating for a radio frequency signal having a frequency between a frequency of a second harmonic component and a frequency of a third harmonic component.

The present disclosure can provide the power amplifier circuit that efficiently amplifies power when a radio frequency signal is amplified by performing envelope tracking control.

Other features, elements, characteristics and advantages of the present disclosure will become more apparent from the following detailed description of embodiments of the present disclosure with reference to the attached drawings.

DETAILED DESCRIPTION

Figure 1:
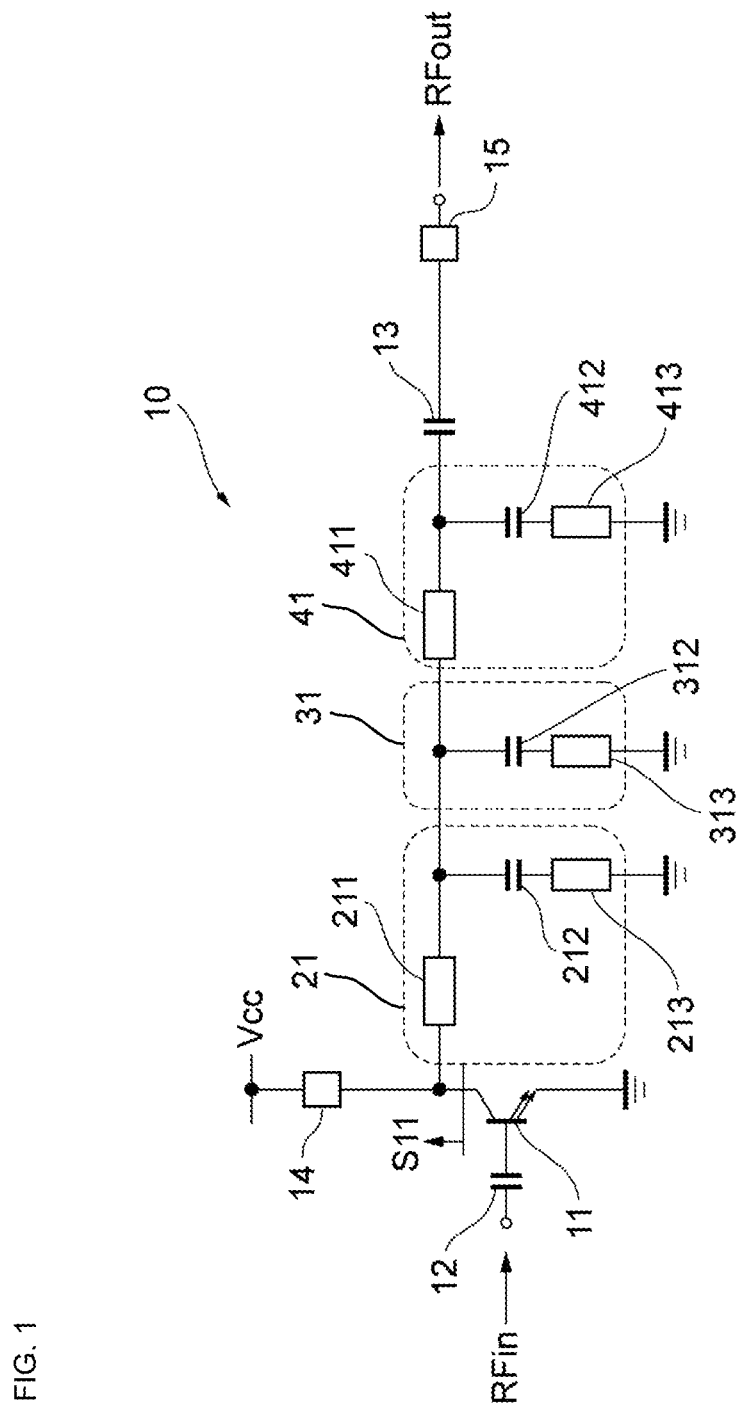
FIG. 1 is a circuit diagram of a power amplifier circuit according to a first embodiment.

Embodiments of the present disclosure will be described in detail below with reference to the drawings. The same elements are denoted by the same reference numerals, and a repeated description thereof is omitted as much as possible.

A power amplifier circuit 10 according to a first embodiment will be described. FIG. 1 is a circuit diagram of the power amplifier circuit 10. The power amplifier circuit 10 includes a transistor 11, capacitance elements 12 and 13, pads 14 and 15, a first termination circuit 21, a second termination circuit 31, and a third termination circuit 41.

The capacitance element 12 is connected to a base of the transistor 11. A collector of the transistor 11 is connected to the pad 14. An emitter of the transistor 11 is grounded. A power supply voltage Vcc controlled by a control circuit (not illustrated) in accordance with the amplitude of an input signal RFin is supplied to the transistor 11 through the pad 14.

From one end of the capacitance element 12, the input signal RFin is supplied. One end of the capacitance element 13 is connected to the pad 15, and the other end is connected to the third termination circuit 41. The capacitance element 12 and the capacitance element 13 are provided to extract an alternating-current component from an RF signal.

Each of the pad 14 and the pad 15 is a member provided to connect the power amplifier circuit 10 and an external element or the like.

The first termination circuit 21 is provided at a stage subsequent to the transistor 11. The second termination circuit 31 is provided at the stage subsequent to the transistor 11. The third termination circuit 41 is provided at the stage subsequent to the transistor 11.

The first termination circuit 21 includes an inductance element 211, a capacitance element 212, and an inductance element 213. One end of the inductance element 211 is connected to the collector of the transistor 11. One end of the capacitance element 212 is connected to the other end of the inductance element 211. One end of the inductance element 213 is connected to the other end of the capacitance element 212. The other end of the inductance element 213 is grounded. A connection relationship between the capacitance element and the inductance elements may be reversed.

The first termination circuit 21 causes an impedance mismatch for, for example, a second harmonic component among harmonic components included in an RF signal output from the collector of the transistor 11. When the impedance mismatch is caused, the second harmonic component is kept from appearing in an output signal RFout.

Incidentally, a component with twice a frequency between a lowest frequency and a highest frequency of transmission frequencies, which are frequencies of an RF signal amplified by the power amplifier circuit 10, is defined as "second harmonic component". A component with three times the frequency between the lowest frequency and the highest frequency of the transmission frequencies is defined as "third harmonic component". Fourth and higher harmonic components are similarly defined.

More specifically, the first termination circuit 21 functions in such a manner as to cause a second harmonic component to be reflected. The second harmonic component caused to be reflected by the first termination circuit 21 is combined with a second harmonic component output from the transistor 11 to generate a standing wave. This keeps a second harmonic component from being output from the pad 15. When a second harmonic component is kept from being output from the pad 15, a second harmonic component of the output signal RFout can be attenuated.

The second termination circuit 31 includes a capacitance element 312 and an inductance element 313. One end of the capacitance element 312 is connected to the other end of the inductance element 211. One end of the inductance element 313 is connected to the other end of the capacitance element 312. The other end of the inductance element 313 is grounded. A connection relationship between the capacitance element and the inductance element may be reversed.

As in the first termination circuit 21, the second termination circuit 31 functions in such a manner as to cause, for example, a third harmonic component among harmonic components included in an RF signal to be reflected. This keeps a third harmonic component from being output from the pad 15. Thus, a third harmonic component of the output signal RFout can be attenuated.

The third termination circuit 41 includes an inductance element 411, a capacitance element 412, and an inductance element 413. One end of the inductance element 411 is connected to the other end of the inductance element 211. The other end of the inductance element 411 is connected to the other end of the capacitance element 13. One end of the capacitance element 412 is connected to the other end of the inductance element 411. One end of the inductance element 413 is connected to the other end of the capacitance element 412. The other end of the inductance element 413 is grounded. A connection relationship between the capacitance element and the inductance elements may be reversed.

As in the first termination circuit 21, the third termination circuit 41 functions in such a manner as to cause, for example, a fourth harmonic component among harmonic components included in an RF signal to be reflected. This keeps a fourth harmonic component from being output from the pad 15. Thus, a fourth harmonic component of the output signal RFout can be attenuated.

The input signal RFin input to the power amplifier circuit 10 is amplified by the transistor 11. Of the amplified signal, a second harmonic component with twice the frequency of a fundamental is attenuated by the first termination circuit 21. A third harmonic component with three times the frequency of the fundamental is attenuated by the second termination circuit 31. A fourth harmonic component with four times the frequency of the fundamental is attenuated by the third termination circuit 41.

Figure 2:
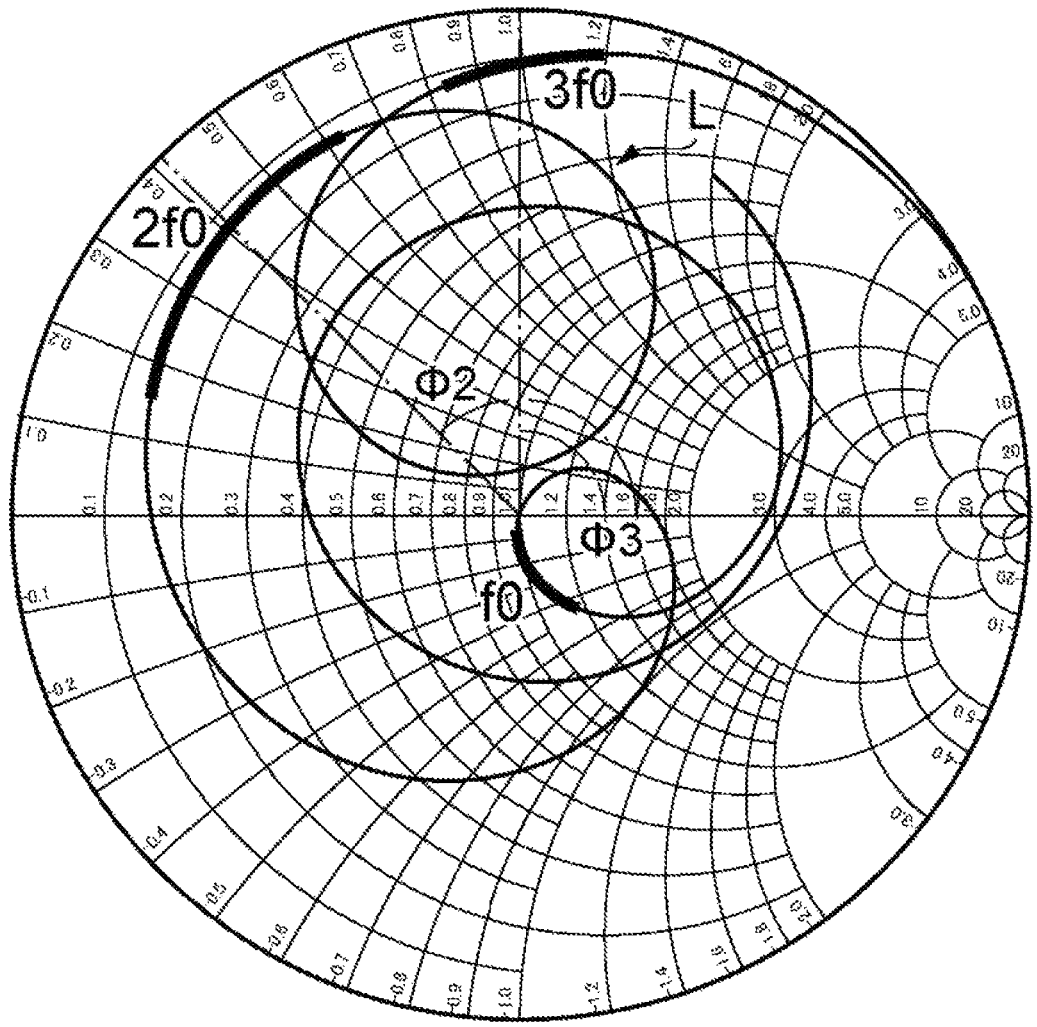
FIG. 2 is a Smith chart illustrating impedance characteristics of the power amplifier circuit according to the first embodiment.

FIG. 2 is a Smith chart illustrating impedance as seen from the collector of the transistor 11 in the power amplifier circuit 10. This Smith chart is normalized by a specific impedance. This Smith chart is drawn by using parameters to be described below.

For example, the inductance of the inductance element 211 is about 0.4 nH, the capacitance of the capacitance element 212 is about 8 pF, and the inductance of the inductance element 213 is about 1.5 nH. The capacitance of the capacitance element 312 is about 8 pF, and the inductance of the inductance element 313 is about 0.9 nH.

For example, the inductance of the inductance element 411 is about 4.3 nH, the capacitance of the capacitance element 412 is about 8.6 pF, and the inductance of the inductance element 413 is about 0.4 nH. The capacitance of the capacitance element 13 is about 27 pF.

In the power amplifier circuit 10, when a frequency is changed from about 100 MHz to about 5 GHz, the Smith chart illustrated in FIG. 2 is drawn. In FIG. 2, for example, a fundamental frequency range f0 ranging from about 663 MHz to about 748 MHz, a second harmonic frequency range 2f0 ranging from about 1.326 GHz to about 1.496 GHz, and a third harmonic frequency range 3f0 ranging from about 1.989 GHz to about 2.244 GHz are each represented by a thick line.

In FIG. 2, in the fundamental frequency range f0, an impedance is located near the center of the Smith chart, and it is found that matching has been achieved at a normalized impedance.

Furthermore, the second harmonic frequency range 2f0 and the third harmonic frequency range 3f0 are located away from the center of the Smith chart, and it is found that matching has not been achieved at the normalized impedance in each region. The closer the second harmonic frequency range 2f0 and the third harmonic frequency range 3f0 are located to a perimeter side of the Smith chart, the higher a reflection coefficient at a frequency in each frequency range is. The reflection coefficient here is a reflection coefficient S11 as seen from the collector of the transistor 11 illustrated in FIG. 1.

In the Smith chart in FIG. 2, from the second harmonic frequency range 2f0 to the third harmonic frequency range 3*f*0, the impedance shifts to a center side of the Smith chart and reaches the third harmonic frequency range 3*f*0 so as to form a loop L.

From the second harmonic frequency range 2*f*0 to the third harmonic frequency range 3*f*0, the impedance moves so that matching is achieved and shifts so that matching is not achieved again when a certain frequency is exceeded, thereby forming the loop L. In this embodiment, such a shift in impedance is called "resonance". In other words, the first termination circuit 21 and the second termination circuit 31 have a property of resonating for a radio frequency signal having a frequency between a frequency of a second harmonic component and a frequency of a third harmonic component.

When resonance is caused to occur, a relationship between the location of the second harmonic frequency range 2*f*0 and the location of the third harmonic frequency range 3*f*0 on the Smith chart can be adjusted. Adjusting impedances on the Smith chart so that the locations of the impedances approach each other refers to reducing a phase difference between an impedance in the second harmonic frequency range 2*f*0 and an impedance in the third harmonic frequency range 3*f*0.

In the Smith chart in FIG. 2, a phase Φ2 with respect to a frequency of a median value of the second harmonic frequency range 2*f*0 is about 140 degrees. A phase Φ3 with respect to a frequency of a median value of the third harmonic frequency range 3*f*0 is about 90 degrees.

Figure 10:
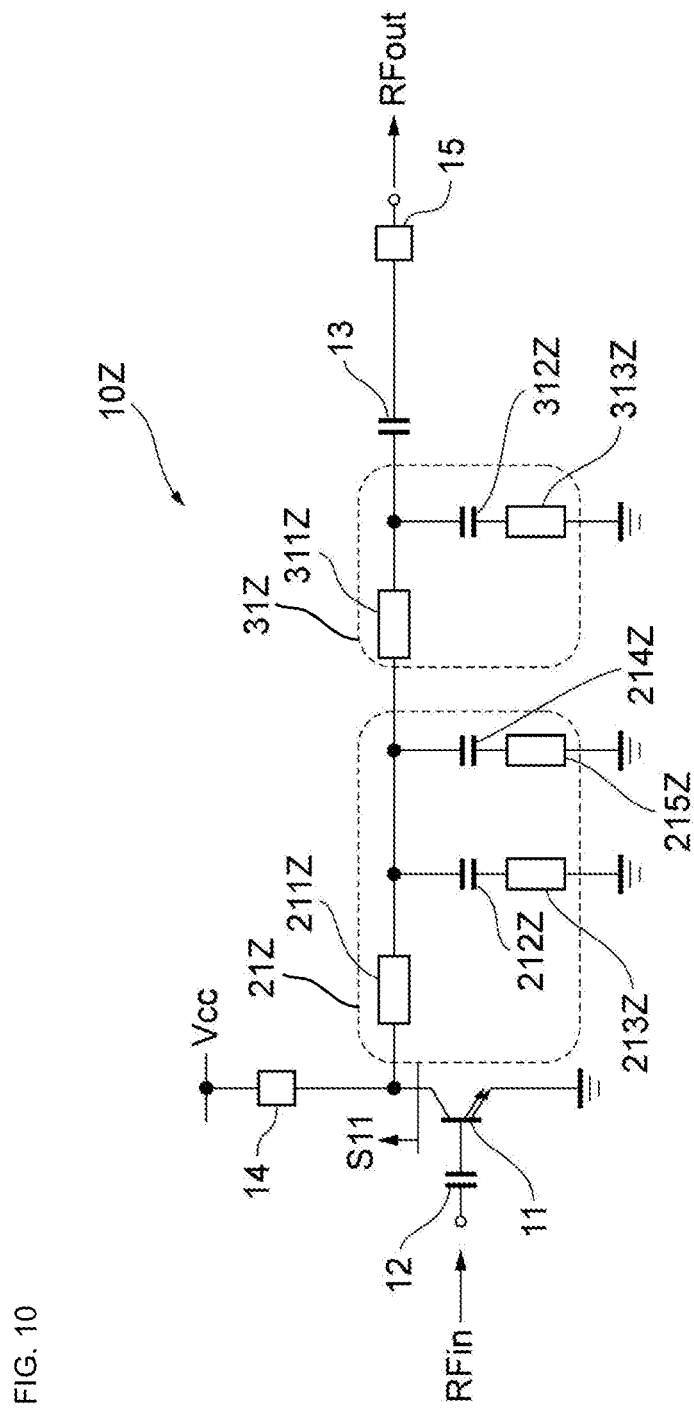
FIG. 10 is a circuit diagram of a power amplifier circuit according to a comparative example.

A frequency response of the power amplifier circuit 10 is compared to that of a power amplifier circuit 10Z as a comparative example illustrated in FIG. 10.

The power amplifier circuit 10Z includes the transistor 11, the capacitance elements 12 and 13, the pads 14 and 15, a first termination circuit 21Z, and a second termination circuit 31Z.

The first termination circuit 21Z includes an inductance element 2112, a capacitance element 212Z, an inductance element 213Z, a capacitance element 214Z, and an inductance element 215Z. As in the first termination circuit 21, the first termination circuit 21Z attenuates a second harmonic component among harmonic components included in an RF signal.

The second termination circuit 31Z includes an inductance element 3112, a capacitance element 312Z, and an inductance element 313Z. As in the second termination circuit 31, the second termination circuit 31Z attenuates a third harmonic component among harmonic components included in an RF signal.

Figure 11:
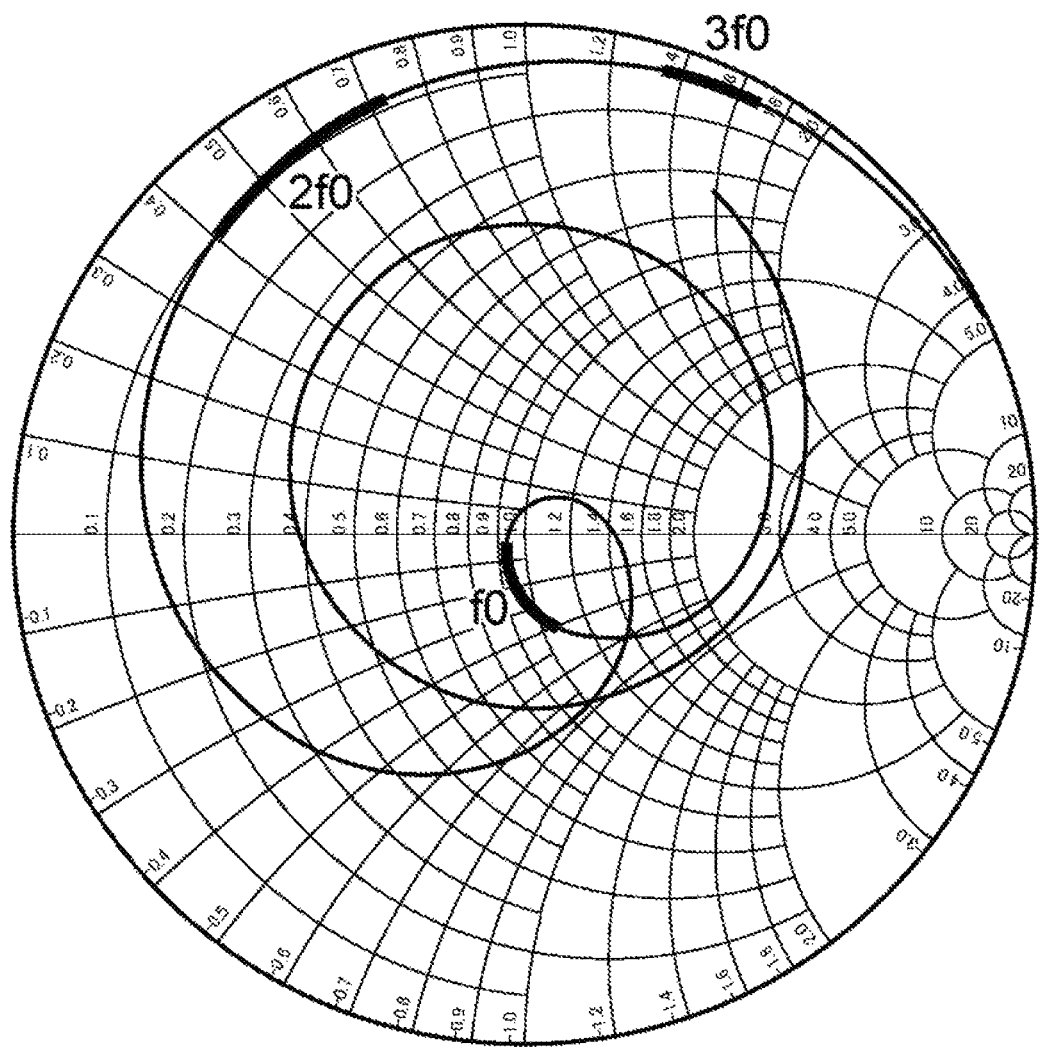
FIG. 11 is a Smith chart illustrating impedance characteristics of the power amplifier circuit according to the comparative example.

FIG. 11 is a Smith chart illustrating impedance as seen from the collector of the transistor 11 in the power amplifier circuit 10Z. This Smith chart is normalized by a specific impedance. This Smith chart is drawn by using parameters to be described below.

For example, the inductance of the inductance element 2112 is about 0.4 nH, the capacitance of the capacitance element 212Z is about 8 pF, and the inductance of the inductance element 213Z is about 1.7 nH. The capacitance of the capacitance element 214Z is about 8 pF, and the inductance of the inductance element 215Z is about 1.7 nH.

For example, the inductance of the inductance element 3112 is about 4.3 nH, the capacitance of the capacitance element 312Z is about 8.6 pF, and the inductance of the inductance element 313Z is about 0.62 nH. The capacitance of the capacitance element 13 is about 27 pF.

In the power amplifier circuit 10Z, when a frequency is changed from about 100 MHz to about 5 GHz, the Smith chart illustrated in FIG. 11 is drawn. In the Smith chart in FIG. 11 as well, the fundamental frequency range f0, the second harmonic frequency range 2*f*0, and the third harmonic frequency range 3*f*0 are each represented by a thick line.

In the Smith chart in FIG. 11, from the second harmonic frequency range 2*f*0 to the third harmonic frequency range 3*f*0, a line representing a frequency response of impedance does not form any loop. Thus, it is found that resonance has not occurred.

Figure 3:
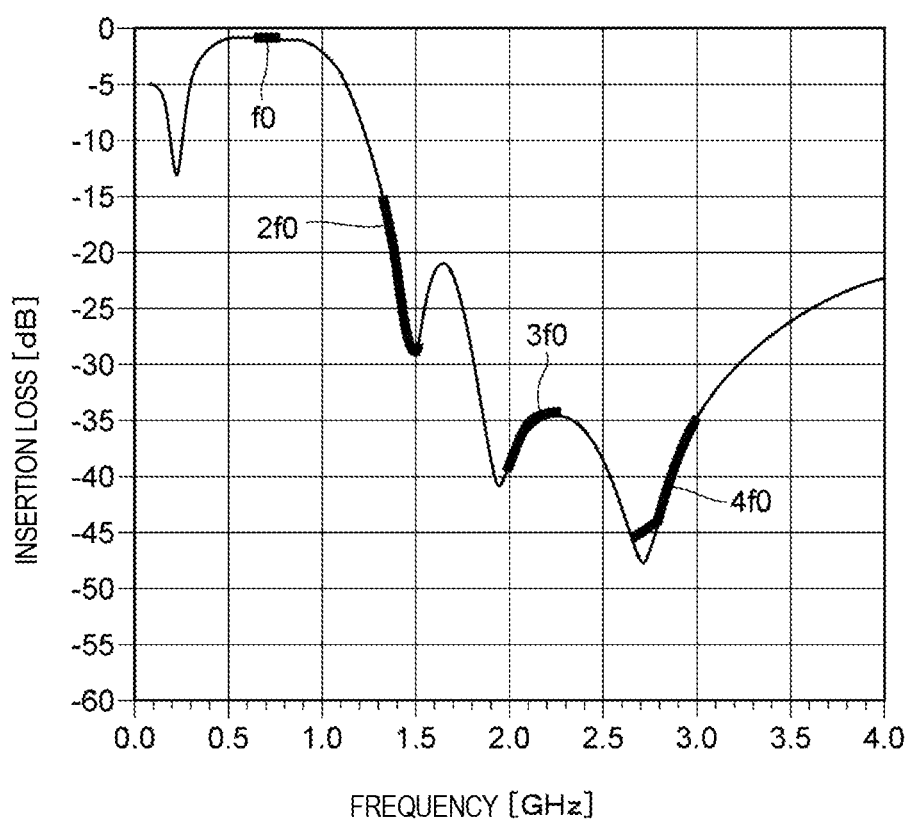
FIG. 3 is a graph illustrating insertion loss in the power amplifier circuit according to the first embodiment.

Attenuation of harmonic components in the power amplifier circuit 10 having impedance characteristics illustrated in FIG. 2 will be described with reference to FIG. 3. FIG. 3 illustrates a relationship between insertion loss and frequency in the power amplifier circuit 10. The fundamental frequency range f0, the second harmonic frequency range 2*f*0, the third harmonic frequency range 3*f*0, and a fourth harmonic frequency range 4*f*0 ranging from about 2.652 GHz to about 2.992 GHz are each represented by a thick line.

An insertion loss in the fundamental frequency range f0 is low. This is because matching has been achieved at an impedance in the fundamental frequency range f0 as illustrated in FIG. 2.

In each of the second harmonic frequency range 2*f*0 and the third harmonic frequency range 3*f*0, an insertion loss is high. In other words, signals in the second harmonic frequency range 2*f*0 and the third harmonic frequency range 3*f*0 have been attenuated. This is because an impedance mismatch has been achieved in each of the second harmonic frequency range 2*f*0 and the third harmonic frequency range 3*f*0 as illustrated in FIG. 2. Hence, the attenuation is attenuation caused by the first termination circuit 21 and the second termination circuit 31 causing a second harmonic component and a third harmonic component to be reflected.

In the fourth harmonic frequency range 4*f*0 as well, an insertion loss is high. In other words, a signal in the fourth harmonic frequency range 4*f*0 has been attenuated. This is attenuation caused by the third termination circuit 41 causing a fourth harmonic component to be reflected.

Figure 12:
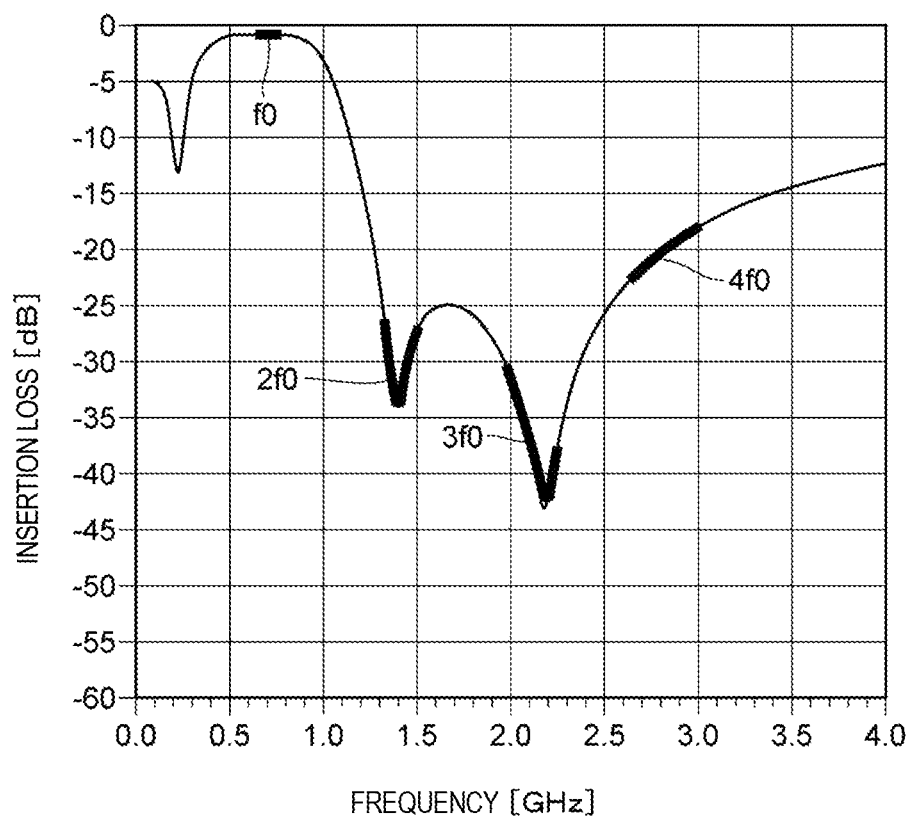
FIG. 12 is a graph illustrating insertion loss in the power amplifier circuit according to the comparative example.

FIG. 12 illustrates a relationship between insertion loss and frequency in the power amplifier circuit 10Z. In the fundamental frequency range f0, the second harmonic frequency range 2*f*0, and the third harmonic frequency range 3*f*0, respective relationships between insertion loss and frequency are similar to those in the power amplifier circuit 10. In the fourth harmonic frequency range 4*f*0, attenuation, such as the attenuation illustrated in FIG. 3, has not been caused because the power amplifier circuit 10Z does not include the third termination circuit 41.

Figure 4:
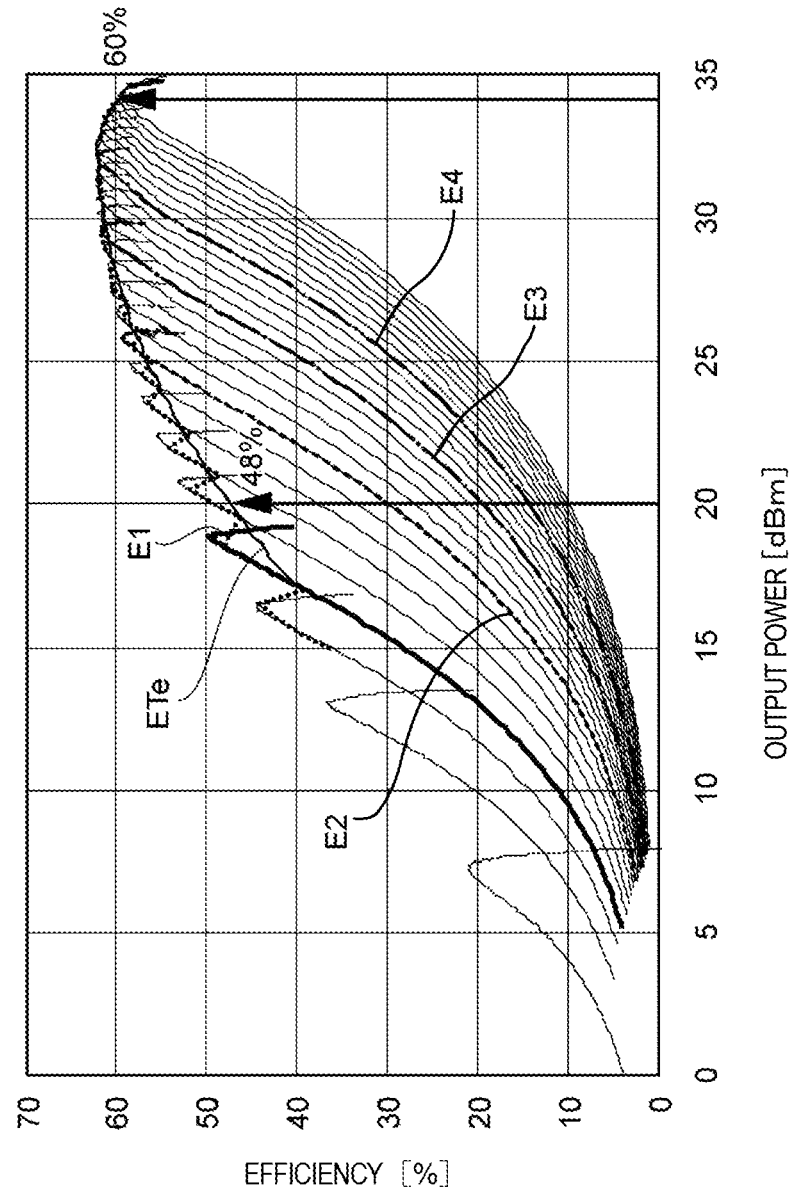
FIG. 4 is a graph illustrating efficiency in the power amplifier circuit according to the first embodiment.

Next, efficiency in the power amplifier circuit 10 will be described with reference to FIGS. 4 and 5. FIG. 4 illustrates a relationship between output power of the collector of the power amplifier circuit 10 and efficiency of the power amplifier circuit 10. In FIG. 4, curves E1, E2, E3, and E4 represent efficiencies of the transistor 11 at respective different power supply voltages. In the power amplifier circuit 10, ET control is performed, and peak values of the efficiencies at the respective power supply voltages supplied to the transistor 11 can therefore be used. A curve ETe in FIG. 4 represents the efficiency of the power amplifier circuit 10.

In the power amplifier circuit 10, an efficiency at an output power of about 20 dBm is about 48%. An efficiency at an output power of about 34 dBm is about 60%. A saturation efficiency is about 62%.

Figure 13:
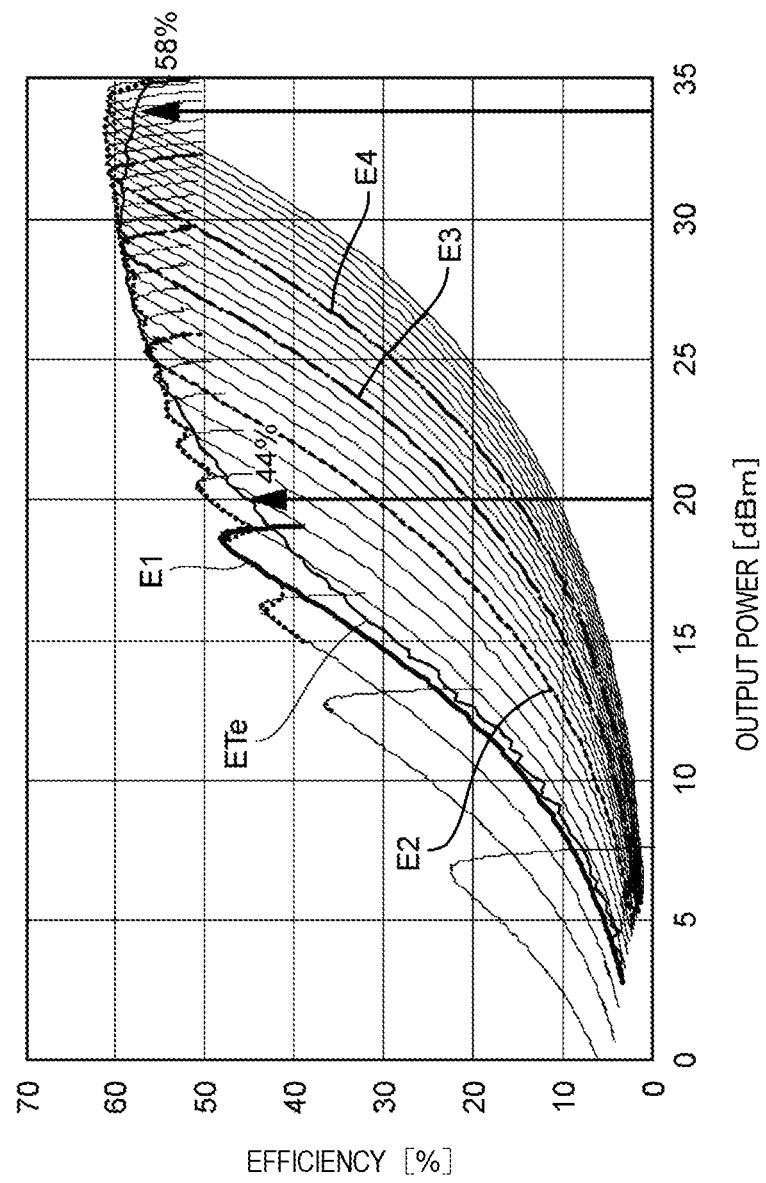
FIG. 13 is a graph illustrating efficiency in the power amplifier circuit according to the comparative example.

The power amplifier circuit 10 and the power amplifier circuit 10Z are compared in terms of efficiency. FIG. 13 illustrates a relationship between efficiency and output power in the power amplifier circuit 10Z exhibited when ET control is performed under conditions similar to those in FIG. 4.

In the power amplifier circuit 10Z, an efficiency at an output power of about 20 dBm is about 44%. An efficiency at an output power of about 34 dBm is about 58%. A saturation efficiency is about 60%. Both in the case of the output power of about 20 dBm and in the case of the output power of about 34 dBm, it is found that efficiencies in the power amplifier circuit 10 to which the present disclosure is applied are high.

The reason why efficiency in the power amplifier circuit 10 is high will be described with reference to FIGS. 5 and 14. FIG. 5 is a graph illustrating a relationship between output power and gain of the power amplifier circuit 10. In FIG. 5, gains of the transistor 11 at the power supply voltages corresponding to the curves E1, E2, E3, and E4 in FIG. 4 are represented by respective curves G1, G2, G3, and G4.

Figure 5:
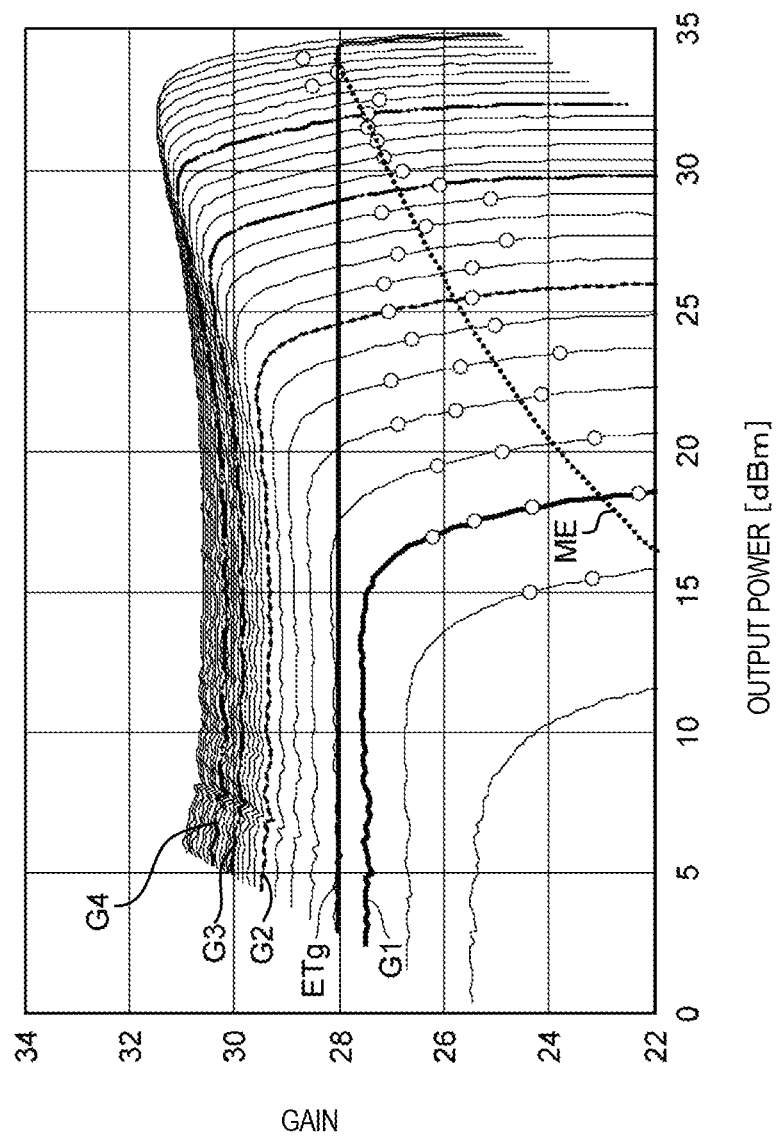
FIG. 5 is a graph illustrating gain in the power amplifier circuit according to the first embodiment.

In FIG. 5, a gain exhibited when ET control is performed is represented as ETg. ET control makes gains of the power amplifier circuit 10 for various output powers be a predetermined value.

In FIG. 5, in relationships between gains and output powers of the transistor 11 at the respective power supply voltages, pairs of output powers and gains at which respective maximum efficiencies are achieved are plotted as points. Furthermore, an approximation curve ME of these points is represented.

Figure 14:
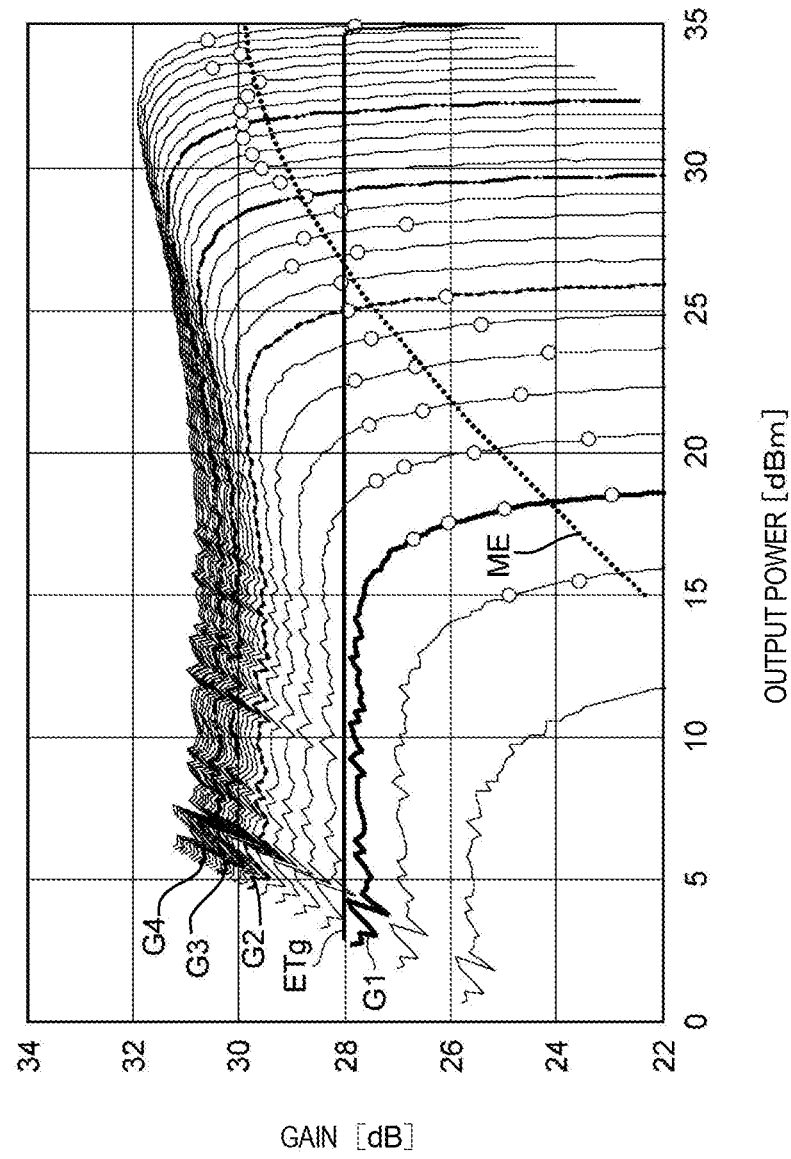
FIG. 14 is a graph illustrating gain in the power amplifier circuit according to the comparative example.

FIG. 14 illustrates a relationship between output power and gain of the power amplifier circuit 10Z. In FIG. 14, in a region where the output power is higher than about 30 dBm, points at which respective maximum efficiencies are achieved and an approximation curve ME are located above a curve ETg. In this case, the power amplifier circuit 10Z is not able to operate at the points at which the respective maximum efficiencies are achieved.

In the power amplifier circuit 10, when an impedance in the second harmonic frequency range 2f0 and an impedance in the third harmonic frequency range 3f0 are brought close to each other, points at which the respective maximum efficiencies are achieved are located near the curve ETg in a region where the output power is high.

When points at which the respective maximum efficiencies are achieved are located near the curve ETg, even in the case of a high output power of, for example, about 34 dBm, the power amplifier circuit 10 can be caused to operate at a point at which a maximum efficiency is achieved. Hence, the power amplifier circuit 10 can efficiently amplify power when an RF signal is amplified by performing ET control.

In the first embodiment, although the first termination circuit 21, the second termination circuit 31, and the third termination circuit 41 are connected in this order from the transistor 11, the order of the first termination circuit 21, the second termination circuit 31, and the third termination circuit 41 may be changed. For example, the second termination circuit 31, the first termination circuit 21, and the third termination circuit 41 may be connected in this order from the transistor 11.

A power amplifier circuit 10A according to a second embodiment will be described. In second and subsequent embodiments, a description of things in common with the first embodiment is omitted, and only respects in which the second and subsequent embodiments differ from the first embodiment will be described. In particular, similar function effects achieved by similar configurations are not repeatedly described in each embodiment.

Figure 6:
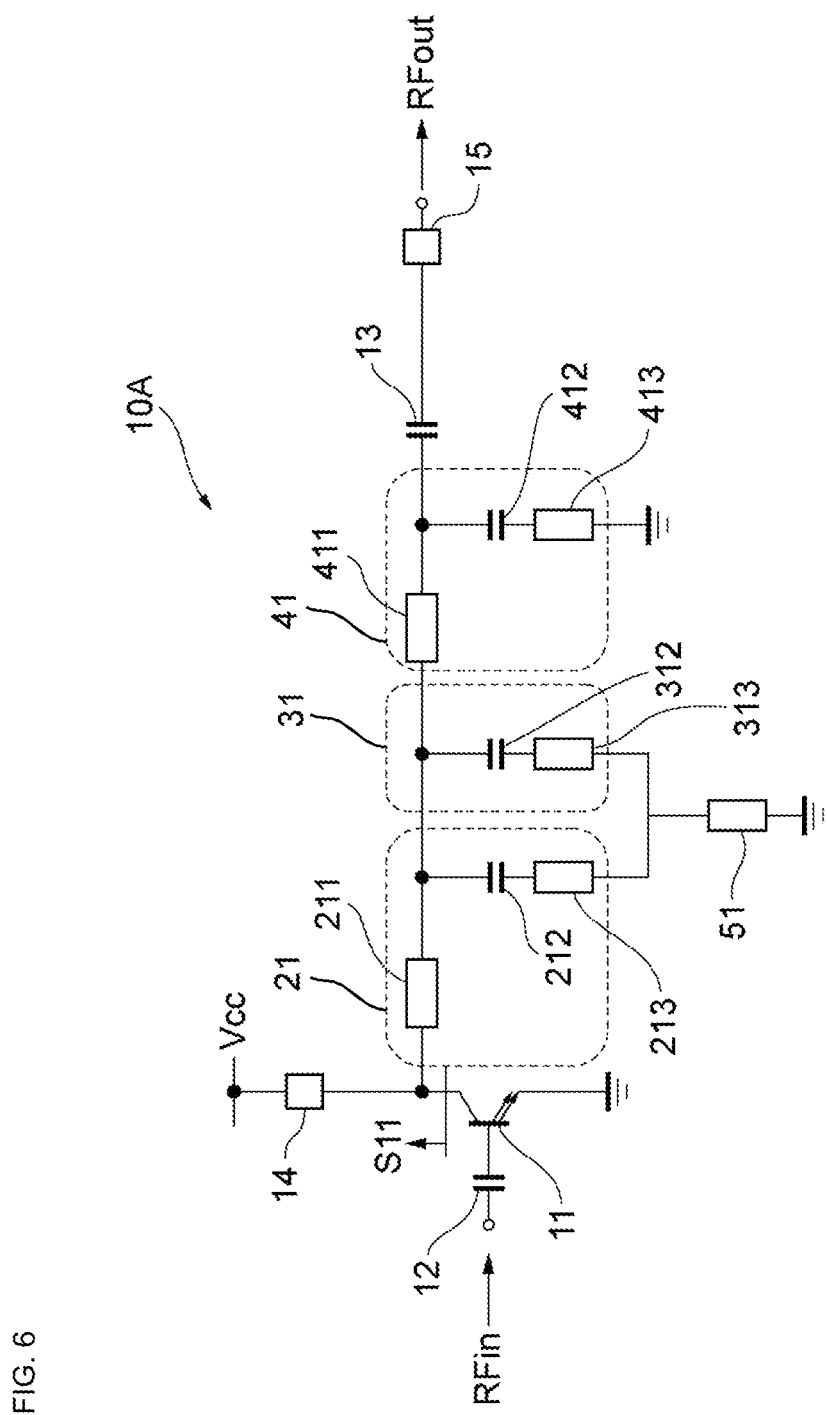
FIG. 6 is a circuit diagram of a power amplifier circuit according to a second embodiment.

As illustrated in FIG. 6, the power amplifier circuit 10A according to the second embodiment has a configuration in which an attenuation inductance element 51 is further provided in the power amplifier circuit 10 according to the first embodiment.

One end of the attenuation inductance element 51 is connected to the first termination circuit 21 and the second termination circuit 31, and the other end is grounded. More specifically, the one end of the attenuation inductance element 51 is connected to the other end of the inductance element 213 and the other end of the inductance element 313. The other end of the attenuation inductance element 51 is grounded. The attenuation inductance element 51 is provided to attenuate a second harmonic component. The attenuation inductance element 51 is formed by, for example, a microstrip line.

Figure 7:
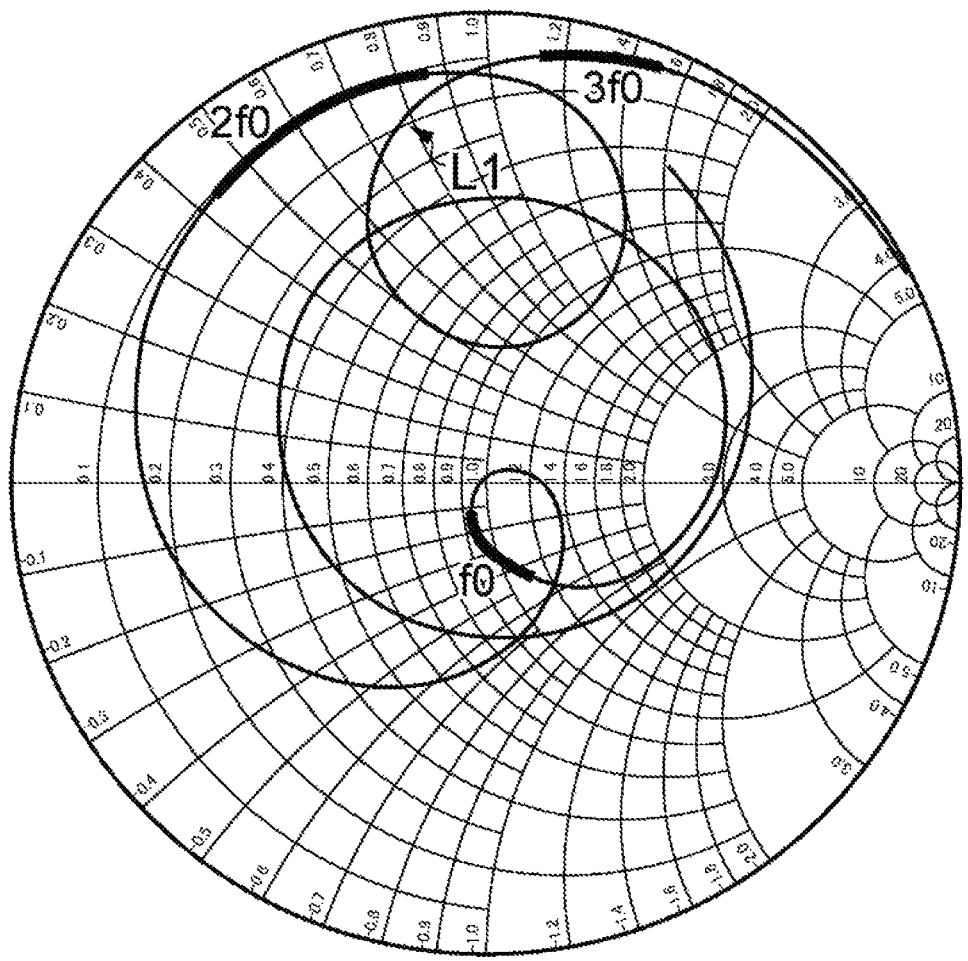
FIG. 7 is a Smith chart illustrating impedance characteristics of the power amplifier circuit according to the second embodiment.

FIG. 7 is a Smith chart illustrating impedance as seen from the collector of the transistor 11 in the power amplifier circuit 10A. This Smith chart is normalized by a specific impedance. This Smith chart is drawn by using the same parameters for the same components as those in the power amplifier circuit 10 according to the first embodiment. For example, the inductance of the attenuation inductance element 51 is about 0.2 nH.

In the power amplifier circuit 10A as well, from the second harmonic frequency range 2f0 to the third harmonic frequency range 3f0, a line representing a frequency response of impedance forms a loop L1. In other words, in the power amplifier circuit 10A as well, resonance has occurred.

Figure 8:
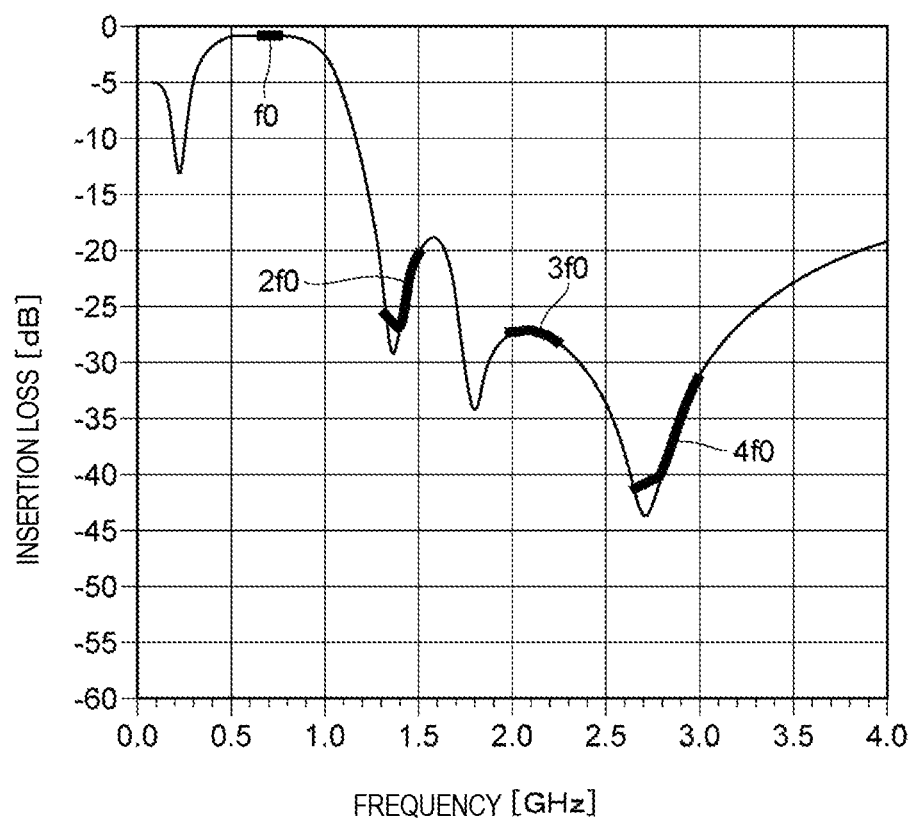
FIG. 8 is a graph illustrating insertion loss in the power amplifier circuit according to the second embodiment.

FIG. 8 illustrates a relationship between insertion loss and frequency in the power amplifier circuit 10A having impedance characteristics illustrated in FIG. 7. The fundamental frequency range f0, the second harmonic frequency range 2f0, the third harmonic frequency range 3f0, and the fourth harmonic frequency range 4f0 are each represented by a thick line.

In FIG. 8, it is found that a signal in the second harmonic frequency range 2f0 has been attenuated by the attenuation inductance element 51 in comparison with the case of the power amplifier circuit 10 in FIG. 3. Thus, the line representing the frequency response of impedance can form the loop L1 while reducing a second harmonic component. In the power amplifier circuit 10A as well, the line representing the frequency response of impedance can form the loop L1, and efficiency exhibited when ET control is performed can therefore be improved.

Figure 9:
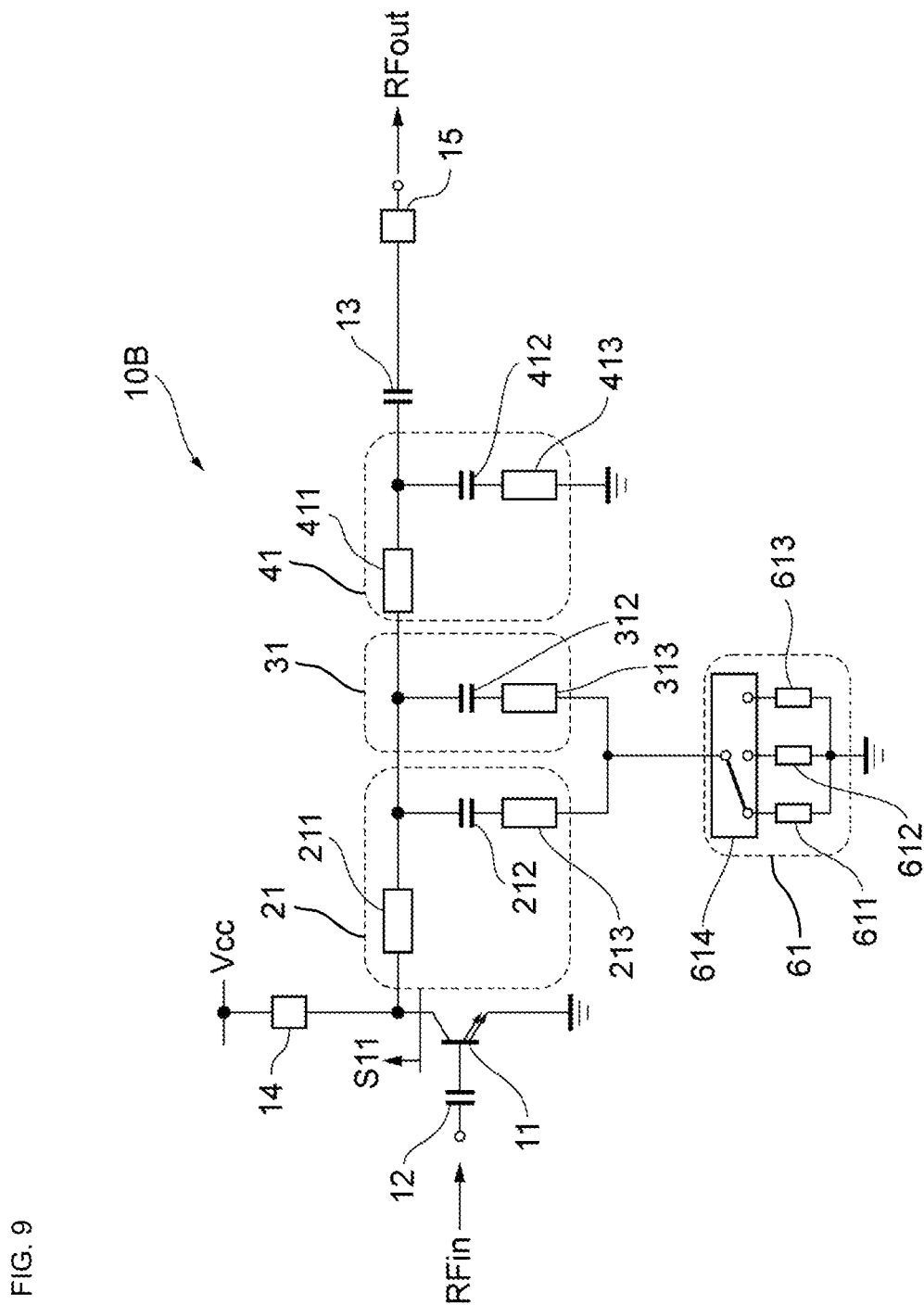
FIG. 9 is a circuit diagram of a power amplifier circuit according to a third embodiment.

A power amplifier circuit 10B according to a third embodiment will be described. As illustrated in FIG. 9, in the power amplifier circuit 10B, a variable inductor unit 61 is provided between the first termination circuit 21 and the second termination circuit 31, and the ground.

The variable inductor unit 61 includes attenuation inductance elements 611, 612, and 613, and a switching element 614.

Respective one ends of the attenuation inductance elements 611, 612, and 613 are grounded. The respective other ends of the attenuation inductance elements 611, 612, and 613 are connected to the switching element 614. The inductances of the attenuation inductance elements 611, 612, and 613 are different from one another.

The switching element 614 is provided between the first and second termination circuits 21 and 31 and the attenuation inductance elements 611, 612, and 613. The switching element 614 connects the first termination circuit 21 and the second termination circuit 31 to the other end of the attenuation inductance element 611, 612, or 613 in accordance with a frequency of the input signal RFin. For example, when a control signal based on a frequency of the input signal RFin is input from an external element or the like, the switching element 614 switches between connection destinations.

Impedance as seen from the collector of the transistor 11 is changed by the switching element 614 connecting the first termination circuit 21 and the second termination circuit 31 to the attenuation inductance element 611, 612, or 613 with a different inductance. In accordance with frequencies of the input signal RFin, when the impedance as seen from the collector of the transistor 11 is changed to values suitable for attenuation of second harmonic components at the individual frequencies, the second harmonic components are appropriately attenuated.

The variable inductor unit 61 changes the impedance as seen from the collector of the transistor 11 so that a line representing a frequency response of the impedance forms a loop while reducing a second harmonic component at each frequency of the input signal RFin. This enables an improve in efficiency exhibited when ET control is performed. In the configuration illustrated in FIG. 9, the variable inductor unit is constituted by three attenuation inductance elements. The number of attenuation inductance elements constituting the variable inductor unit is not limited to three and may be two, four, or n.

The exemplary embodiments of the present disclosure have been described above. The power amplifier circuit 10 according to an embodiment includes the transistor 11 having a base to which a radio frequency signal is input and a collector to which a power supply voltage Vcc that varies in accordance with an envelope of amplitude of the radio frequency signal is supplied and from which an amplified signal obtained by amplifying the radio frequency signal is output; the first termination circuit 21 provided at a stage subsequent to the transistor 11 and configured to attenuate a second harmonic component of the amplified signal; and the second termination circuit 31 provided at the stage subsequent to the transistor 11 and configured to attenuate a third harmonic component of the amplified signal. The first termination circuit 21 and the second termination circuit 31 have a property of resonating for a radio frequency signal having a frequency between a frequency of the second harmonic component and a frequency of the third harmonic component.

The first termination circuit 21 and the second termination circuit 31 have a property of resonating for a radio frequency signal having a frequency between a frequency of the second harmonic component and a frequency of the third harmonic component, and impedances for the second harmonic component and the third harmonic component can therefore be adjusted.

When impedances for the second harmonic component and the third harmonic component are adjusted, the transistor 11 can be caused to operate at an operating point at which a maximum efficiency is achieved for each power supply voltage Vcc. Hence, the power amplifier circuit 10 can efficiently amplify power when a radio frequency signal is amplified by performing envelope tracking control.

The power amplifier circuit 10A further includes the attenuation inductance element 51 having one end connected to the first termination circuit 21 and the second termination circuit 31 and the other end grounded.

This enables impedances for a second harmonic component and a third harmonic component to be adjusted while ensuring attenuation of the second harmonic component. The power amplifier circuit 10A can efficiently amplify power in ET control as well.

The power amplifier circuit 10B further includes the variable inductor unit 61 provided between the first termination circuit 21 and the second termination circuit 31, and the ground. The variable inductor unit 61 includes the attenuation inductance elements 611, 612, and 613 having one ends grounded, and the switching element 614 configured to connect the first termination circuit 21 and the second termination circuit 31 to any of the other ends of the attenuation inductance elements 611, 612, and 613 in accordance with a frequency of the radio frequency signal.

Thus, for radio frequency signals with different frequencies as well, impedances for a second harmonic component and a third harmonic component can be adjusted while ensuring attenuation of second harmonic components at the individual frequencies. The power amplifier circuit 10B can efficiently amplify power in ET control as well.

In the power amplifier circuit 10, the first termination circuit 21 includes the inductance element 211 having one end connected to the collector of the transistor 11, the capacitance element 212 having one end connected to the other end of the inductance element 211, and the inductance element 213 having one end connected to the other end of the capacitance element 212 and disposed between the capacitance element 212 and the ground. The second termination circuit 31 includes the capacitance element 312 having one end connected to the other end of the inductance element 211, and the inductance element 313 having one end connected to the other end of the capacitance element 312 and disposed between the capacitance element 312 and the ground.

When inductances of the inductance element 213 and the inductance element 313 are adjusted, impedances for a second harmonic component and a third harmonic component can be adjusted. In other words, when the inductances of the inductance element 213 and the inductance element 313 are appropriately changed, power can be efficiently amplified.

The power amplifier circuit 10 further includes the third termination circuit 41 provided at the stage subsequent to the transistor 11 and configured to attenuate a fourth harmonic component of the amplified signal. This can keep a fourth harmonic component from being included in the output signal RFout.

The above-described embodiments are intended to facilitate understanding of the present disclosure but are not intended for a limited interpretation of the present disclosure. The present disclosure can be changed or improved without necessarily departing from the gist thereof and encompasses equivalents thereof. That is, appropriate design changes made to the embodiments by those skilled in the art are also encompassed in the scope of the present disclosure as long as the changes have features of the present disclosure. For example, the elements included in the embodiments, and the arrangement, materials, conditions, shapes, sizes, and so forth of the elements are not limited to those exemplified herein and can be appropriately changed. Furthermore, the embodiments are illustrative, and it goes without necessarily saying that configurations described in different embodiments can be partially replaced or combined. Such replacement and combination are also encompassed in the scope of the present disclosure as long as they have features of the present disclosure.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier circuit comprising:
a transistor having a base to which a radio frequency signal is input, and a collector to which a power supply voltage is supplied and from which an amplified signal is output, wherein the power supply voltage varies in accordance with an envelope of an amplitude of the radio frequency signal, and the amplified signal is obtained by amplifying the radio frequency signal;
a first termination circuit at a stage subsequent to the transistor, and configured to attenuate a harmonic component of the amplified signal; and
a second termination circuit at the stage subsequent to the transistor, and configured to attenuate the or another harmonic component of the amplified signal,
wherein the first termination circuit and the second termination circuit have a resonance frequency between a second harmonic component and a third harmonic component of the radio frequency signal.

2. The power amplifier circuit according to claim 1, further comprising:
an attenuation inductance element having a first end connected to the first termination circuit and to the second termination circuit, and a second end that is grounded.

3. The power amplifier circuit according to claim 1, further comprising:
a variable inductor between the first termination circuit and the second termination circuit, and ground,
wherein the variable inductor comprises:
a plurality of attenuation inductance elements, each of the plurality of attenuation inductance elements having a first end that is grounded, and
a switch configured to connect the first termination circuit and the second termination circuit to any second end of the plurality of attenuation inductance elements in accordance with a frequency of the radio frequency signal.

4. The power amplifier circuit according to claim 1, wherein:
the first termination circuit comprises:
a first inductance element having a first end connected to the collector of the transistor,
a first capacitance element having a first end connected to a second end of the first inductance element, and
a second inductance element between the first capacitance element and ground, and having a first end connected to a second end of the first capacitance element, and
the second termination circuit comprises:
a second capacitance element having a first end connected to the second end of the first inductance element, and
a third inductance element between the second capacitance element and ground, and having a first end connected to a second end of the second capacitance element.

5. The power amplifier circuit according to claim 2, wherein:
the first termination circuit comprises:
a first inductance element having a first end connected to the collector of the transistor,
a first capacitance element having a first end connected to a second end of the first inductance element, and
a second inductance element between the first capacitance element and ground, and having a first end connected to a second end of the first capacitance element, and
the second termination circuit comprises:
a second capacitance element having a first end connected to the second end of the first inductance element, and
a third inductance element between the second capacitance element and ground, and having a first end connected to a second end of the second capacitance element.

6. The power amplifier circuit according to claim 3, wherein:
the first termination circuit comprises:
a first inductance element having a first end connected to the collector of the transistor,
a first capacitance element having a first end connected to a second end of the first inductance element, and
a second inductance element between the first capacitance element and ground, and having a first end connected to a second end of the first capacitance element, and
the second termination circuit comprises:
a second capacitance element having a first end connected to the second end of the first inductance element, and
a third inductance element between the second capacitance element and ground, and having a first end connected to a second end of the second capacitance element.

7. The power amplifier circuit according to claim 1, further comprising:
a third termination circuit at the stage subsequent to the transistor and configured to attenuate a fourth harmonic component of the amplified signal.

8. The power amplifier circuit according to claim 2, further comprising:
a third termination circuit at the stage subsequent to the transistor and configured to attenuate a fourth harmonic component of the amplified signal.

9. The power amplifier circuit according to claim 3, further comprising:
a third termination circuit at the stage subsequent to the transistor and configured to attenuate a fourth harmonic component of the amplified signal.

10. The power amplifier circuit according to claim 4, further comprising:
a third termination circuit at the stage subsequent to the transistor and configured to attenuate a fourth harmonic component of the amplified signal.

* * * * *

UNITED STATES PATENT AND TRADEMARK OFFICE
CERTIFICATE OF CORRECTION

PATENT NO. : 11,469,711 B2
APPLICATION NO. : 16/891701
DATED : October 11, 2022
INVENTOR(S) : Mitsunori Samata It is certified that error appears in the above-identified patent and that said Letters Patent is hereby corrected as shown below:

In the Specification

Column 5, Line 37, "2112" should be -- 211Z --.

Column 5, Line 44, "3112" should be -- 311Z --.

Column 5, Line 55, "2112" should be -- 211Z --.

Column 5, Line 61, "3112" should be -- 311Z --.

Signed and Sealed this
Fourth Day of July, 2023

Katherine Kelly Vidal
*Director of the United States Patent and Trademark Office*